United States Patent [19]
Keller

[11] Patent Number: 6,045,617
[45] Date of Patent: Apr. 4, 2000

[54] METHOD FOR CVD SURFACE COATING AND CVD REACTOR SYSTEM

[75] Inventor: Klaus Keller, Wangen, Switzerland

[73] Assignee: Verschleiss-Schutz-Technik Keller GmbH & Co. KG, Schopfheim, Germany

[21] Appl. No.: 09/166,513

[22] Filed: Oct. 5, 1998

[30] Foreign Application Priority Data

Oct. 4, 1997 [DE] Germany .......................... 197 43 922

[51] Int. Cl.[7] .................................................. C23C 16/00
[52] U.S. Cl. ..................... 118/707; 118/715; 118/733; 137/375; 137/625.46
[58] Field of Search ................................. 118/707, 715, 118/733; 137/375, 625.46

[56] References Cited

U.S. PATENT DOCUMENTS

| | | | |
|---|---|---|---|
| 4,614,205 | 9/1986 | Oroskar | 137/625.46 |
| 5,277,144 | 1/1994 | Moody | 137/625.46 |
| 5,441,570 | 8/1995 | Hwang | 118/725 |
| 5,503,875 | 4/1996 | Imai | 427/255.3 |

*Primary Examiner*—Richard Bueker
*Attorney, Agent, or Firm*—Foley, Hoag & Eliot LLP

[57] ABSTRACT

Disclosed herein is a method and a reactor system for CVD surface coating. In this method, the reaction gas is supplied to the reactor chamber with any frequency and at any time intervals in succession, rising and falling in the form of a pulsed gas stream. The reversal of the gas flow direction is performed by a multipath valve located inside the reactor which can be controlled from outside by means of an adjusting shaft.

20 Claims, 8 Drawing Sheets

METHOD FOR CVD SURFACE COATING AND CVD REACTOR SYSTEM

BACKGROUND OF THE INVENTION

1. Field of the Invention

This application relates to the field of surface coatings and more particularly to the field of surface coatings using chemical vapor deposition.

2. Description of Related Art

Chemical Vapor Deposition (CVD) coating relates to a technique in which gaseous substances are brought into a chemical reaction with the surfaces of other materials, for example tools for metalworking, under certain pressure and temperature conditions, so that the molecules contained in the gases are deposited on the surfaces of the other materials as a result of thermal reactions to form a coating. CVD coating is generally known in the prior art.

The design of such a coating system is described for example by Hegi in the journal "Metalloberfläche," Vol. 37, 1983, No. 4, pages 166–168. In systems of this kind, the coating of the work pieces takes place in a reactor chamber, in this case with a rising reaction gas. In this coating system the gases, in other words the reaction gas mixture, is introduced through a central tube in such fashion that it rises in the reaction chamber, i.e. in the vicinity of the work pieces, with the process gases being drawn off through an exhaust pipe located above and then conducted to an exhaust-gas-neutralizing unit outside the reaction chamber.

Likewise, in the system known from U.S. Pat. No. 5,503,875, the reaction gas mixture is introduced into the reaction chamber, but laterally in this case, in such fashion that it rises. In addition, systems are known for example from U.S. Pat. No. 5,441,570 in which the reaction mixture is introduced from above, in other words so that it falls.

In addition, a device is described in DD 111 935 B1 in which the reaction gas mixture is introduced through a central tube that has gas outlets distributed over its height. In the reaction chamber, the reaction gas mixture always flows radially from the inside to the outside, in other words perpendicularly to the lengthwise axis of the reaction chamber.

The known versions mentioned here as examples show that in CVD systems, the flow conditions of the gaseous reactants are important criteria for the function, since when the reaction gas mixture is introduced into the reactor, the concentration of components that are capable of reacting (for example $TiCl_4$, $CH_4$, $N_2$, etc.) necessarily decreases continuously in the flow direction. As a result, the layer-formation conditions also change continuously and the work pieces that are located in the reactor further away from the point of introduction, for example, are coated to a lesser degree or are not coated at all. In addition, the adhesion conditions change, as does the chemical composition, and possibly also the crystal alignment, the topography, etc. and thus the application-relevant quality level of the coatings decreases rapidly along the flow direction. This decrease is often unacceptable, especially in areas located more remotely from the point of introduction, in other words, in the vicinity of the exhaust gas location.

As a result of the difficulties discussed above, the length or height of reactors and hence the useful reaction space are limited. Thus, for example, hydrochloric acid (HCl), which is highly corrosive and is produced at a coating temperature of 1000° C., will etch the work piece surfaces to an unacceptable degree further away from the point of introduction, while the desired layer formation takes place properly in the area near the point of introduction but may not take place further away from the point of introduction.

Since the decrease in concentration varies as a function of the gas mixture and type of coating, i.e. the layers are produced at different rates, in multilayer coatings (for example TiC—TiCN—TiN, with TiN as the outermost cover layer) a layer thickness distribution takes place under certain conditions such that the desired multilayer coating is not present at all on work pieces that are more remote from the point at which the gas is introduced. For example, there may instead be only a thin (and possibly even nonexistent) TiN layer on an etched work piece surface which is unacceptably roughened by etching. Layers of this kind are of unacceptable quality so that work pieces thus damaged may have to be discarded.

In addition, material transfers in the flow direction that are unsatisfactory because of disturbing values caused by decomposition can occur in the flow direction which result in application-relevant problems of coating adhesion as the size of the reactor chamber increases.

Another problem is posed by so-called Luv-Lee effects which cause different layer thicknesses depending on whether the surface to be coated is subjected to a frontal flow or whether this surface is on the side that faces away from the stream directed against it.

It is desirable to provide a method and a reactor system for CVD surface coating in which the disadvantages listed above are avoided, in other words the extremely important averaging of the reaction behavior along the flow to promote exact process control, layer quality, improvement of multilayer coatings, process yield, reactor upscaling, and cost reduction are achieved.

SUMMARY OF THE INVENTION

According to the present invention, reaction gas is constantly introduced into the reactor chamber at any frequency and at any time intervals, successively falling and rising in the form of a pulsed gas stream.

For example, the reaction gas, following the start of the process, can be introduced during the first quarter hour, rising for one minute and falling for half a minute, followed by other gas direction change data that can be altered as desired. This results in a pulsed gas stream as well as a favorable vorticization and thorough mixing of the gas. As a result, in large reaction chambers for all the workpieces to be coated, very uniform coating properties can be achieved in terms of structure, composition, layer thickness, and coating topography even when the Luv-Lee problem is eliminated, as would otherwise not be possible even in small reactors. Since this means that the precipitation kinetics throughout the reaction chamber are also much easier to control and direct largely independently of its size, an outstanding basis is obtained for multiple- and many-layer systems, as well as for the latest multilayer technology with submicrometer to nanometer structures. This in turn is particularly important for uniform maximally reliable coating of large and/or long tools, especially for coating large tools.

The method according to the invention cannot be performed satisfactorily or in the long term using conventional CVD systems, so that a new design of the CVD reactor system is proposed.

In CVD coating, the reaction gases have temperatures on the order of 900 to 1000° C. To switch the flow direction of these reaction gases in the reactor itself, reversing valves with extremely high heat resistance are required. Although a switch in flow direction could be accomplished with the aid of valves mounted outside the heated reactor chamber, these would very soon leak because of the usually corrosive gas mixtures used. In particular however the exhaust valves would very quickly become clogged. The main reason for the clogging is the solid precipitation of chlorides, oxides, and solid particles which precipitate at temperatures below 400 to 500° C. to form hard crusts in the cooler exhaust systems.

Nevertheless, in order to achieve gas flow with direction reversal that can be controlled as desired, a completely new reaction gas reversal system is proposed that permits gas switching only slightly below the reaction temperature (up to 1100° C.) at the shortest time intervals and with any desired intervals in a manner that ensures long-term function, and this system must therefore be extremely heat-resistant but in particular extremely resistant to heat corrosion because of the extremely corrosive decomposition products and exhaust gases.

A precondition is that the element that serves to reverse the gas, namely a multipath valve is located as close as possible to the reaction chamber for thermal reasons and is integrated into a suitably heated valve housing, with all of the structural elements being made of temperature- and corrosion-resistant graphite. According to another proposal, this valve located inside the reaction chamber is actuated by an adjusting shaft that can be operated from outside.

Additional measures, especially for ensuring operating safety, relate to a seal improved for the safety of the reactor between the reactor bottom and reactor housing and/or for monitoring the sealing system.

BRIEF DESCRIPTION OF DRAWINGS

In addition, the advantages that can be achieved by the proposals according to the invention as well as the subject of the invention itself will now be described in detail with reference to the drawings described below.

DETAILED DESCRIPTION OF THE PREFERRED EMBODIMENT(S)

Figure 1A:
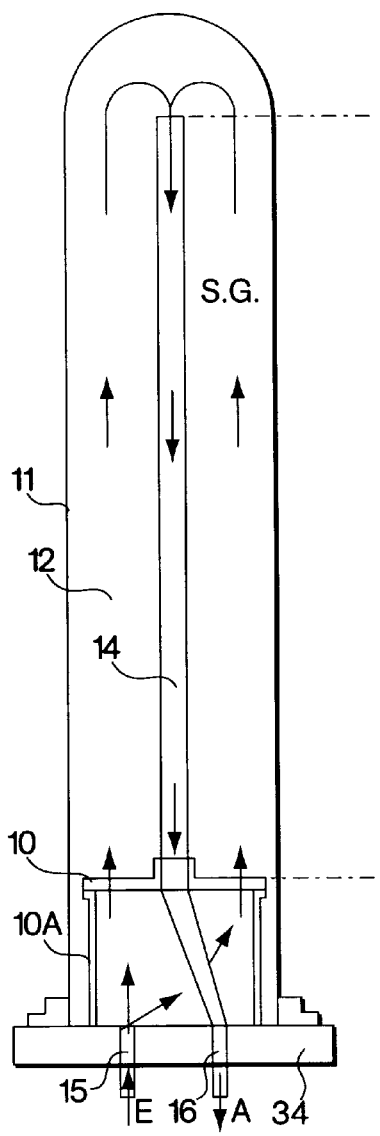
FIGS. 1A and 2A are schematic diagrams of a conventional CVD reactor in which the reaction gas is introduced and rises.

In FIG. 1A, a conventional CVD reactor is shown schematically, but without the hood-type furnace that surrounds the reactor.

Figure 3A:
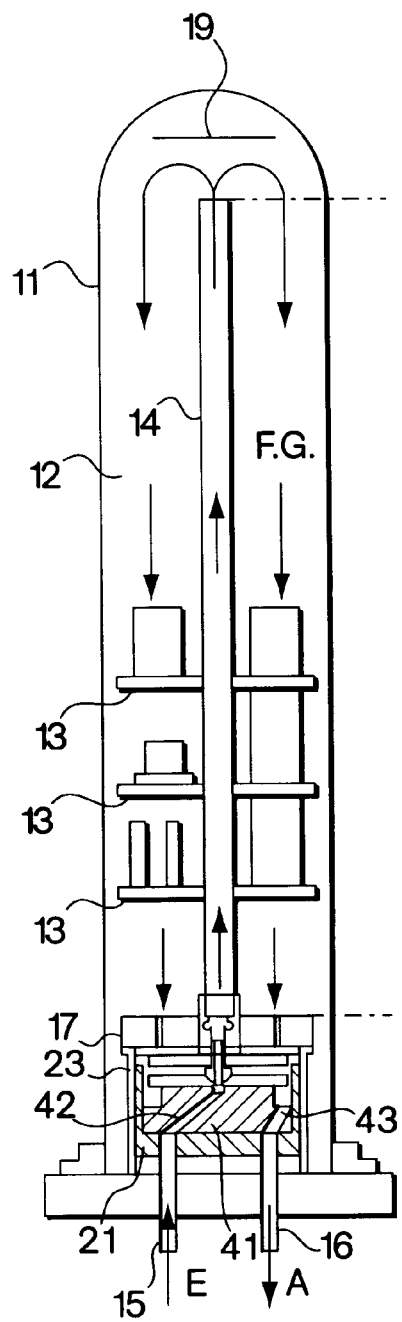
FIG. 3A is a schematic diagram of a CVD reactor according to the invention in which the reaction gas mixture is introduced and falls in the reactor chamber during a first interval.

This reactor consists of a reactor housing 11 that surrounds reactor chamber 12. The housing 11 is sealed off domewise at an upper end thereof and is sealed off at a lower end by means of reactor bottom 34. Inside the reactor chamber 12 is a central gas tube 14 for introducing and/or removing the reaction gas mixture. Star-shaped workpiece holders 13 that support the workpieces 18 to be coated are provided on the central gas tube 14, as shown in FIGS. 3A and 3C, Gas supply E or removal A takes place through an inlet pipe 15 and an exhaust pipe 16, respectively, as indicated by the arrows. The central gas tube 14 is supported by a base plate 10 with a spacing tube 10a.

Figure 1B:
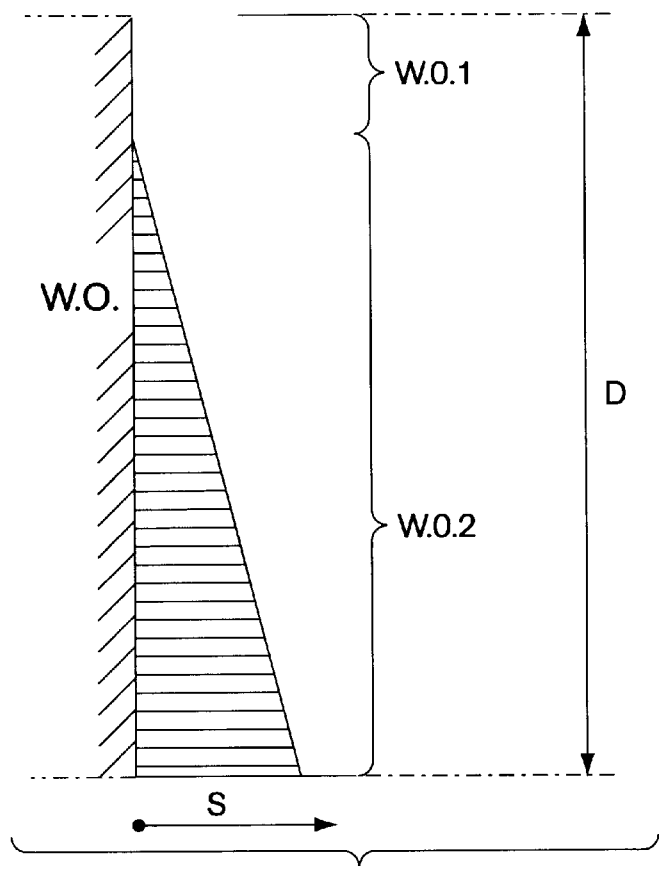
FIG. 1B is a graph showing the coating thickness distribution in the elongated reaction chamber of the reactor according to FIG. 1A.

As indicated by the arrows surface coating is shown in FIG. 1A as taking place with rising gas, S.G., which produces the coating thickness distribution on the work piece surface W.O. shown schematically in the graph according to FIG. 1B. The graph shows the coating thickness distribution S on the work piece surfaces as a function of reaction distance D and/or the position of the work pieces within a tightly packed reactor chamber 12.

As the graph in FIG. 1B shows, the work piece surfaces may be exposed in the area marked W.O.1 to a destructive corrosive effect of the reaction gas mixture, so that the surfaces of the work pieces that are located in this area are not coated, and can even be severely etched under certain conditions.

Figure 2A:
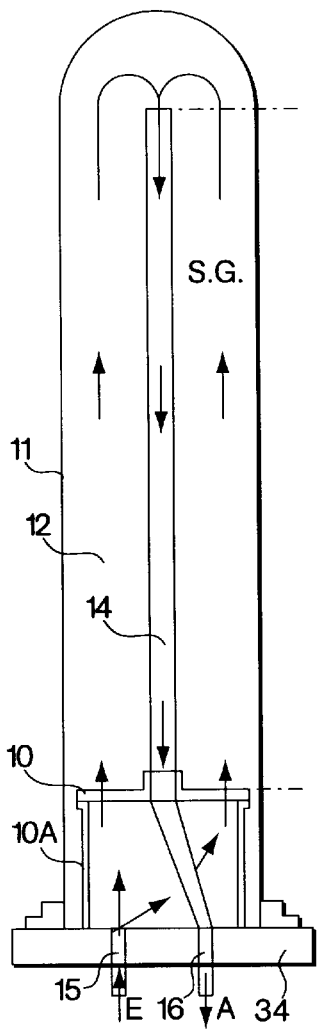
Figure 2B:
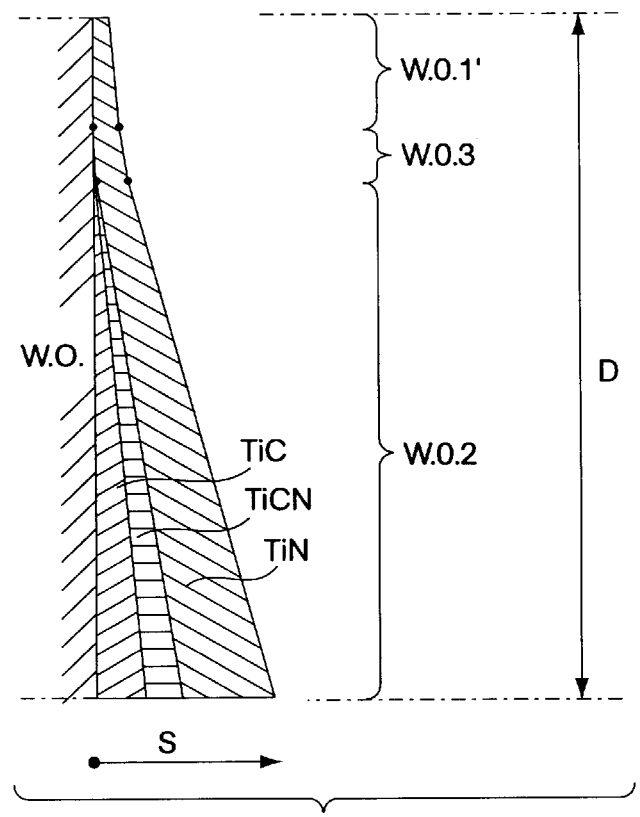
FIG. 2B is a graph of the coating thickness distribution similar to the graph in FIG. 1B but with a TiC—TiCN—TiN triplex coating.

The illustrations in FIGS. 2A and 2B show the coating of the workpiece surface with a TiC—TiCN—TiN triplex coating, likewise with a rising gas S.G. The view in FIG. 2A therefore corresponds to the view in FIG. 1A.

The graph in FIG. 2B, like the graph in FIG. 1B, shows the coating thickness distribution of the various layers superimposed on one another in schematic form. As in the case shown in FIG. 1B, here again the layers develop at different rates along reaction distance D, so that as stated at the outset, even with a multilayer coating, nonuniform coating thickness distribution of the individual layers takes place. For example, in the case of TiN deposition, the coating is sufficient over a greater reaction distance and is therefore able to cover the area W.O.1' not coated by TiC and TiCN, but on a surface more or less etched during TiC or TiCN deposition.

In area W.O.3, a thin TiC coating of limited thickness is formed prior to the deposition of the TiN coating, but it is sufficient to prevent excessive etching. It is only in area W.O.2 that a complete triplex coating is formed, but similarly with a thickness of the individual coating layers that depends on reaction distance D.

With the reactor designed according to the invention, as shown schematically in FIGS. 3A and 3C, even with a greater height, in other words with long flow paths and/or reaction distances D, uniform coating is possible as explained below. By means of a multipath valve or reversing valve 40 proposed according to the invention, whose design and function will be explained below with reference to FIGS. 4A and 4B, it is possible to change the flow direction of the reaction gas mixture during the coating process so that, as in the arrangement according to FIG. 3A, initially falling gas F.G. and then rising gas S.G., as illustrated in FIG. 3C, flows through reactor chamber 12.

This type of gas guidance affects the surface coating of the work pieces 18. The work pieces 18 are located inside the reactor chamber 12 on work piece holders 13 that consist of heat-resistant material, the holders 13 surrounding the central gas tube 14, which in turn is supported by a base holder 17. Both the reactor housing 11 and the central gas tube 14 may be made from alloys that are highly resistant to heat and corrosion.

The reaction gas mixture is introduced at E from outside through the inlet tube 15 that passes through the reactor bottom 34 and is fed to multipath valve 40 (FIG. 1) which is supported by the reactor bottom 34 via a carrier tube 23. The reaction gas introduced through the inlet tube 15 in the position shown in FIG. 3A passes through the valve duct 42 in the valve plate 41 into the central gas tube 14, is carried upward, and is deflected above the central gas tube 14 outlet by means of a baffle plate 19 so that it enters the reactor chamber 12 as a falling gas F.G. to coat the work pieces 18. The gas releases the donor substances required for coating formation as a result of heterogeneous reactions on the work pieces and/or tools 18 that are supported on the workpiece holders 13.

As it continues traveling, the reaction gas becomes increasingly impoverished with respect to donor substance reactants and becomes enriched with decomposition products as explained above. Finally, the gas is drawn off as exhaust gas through a double-armed valve duct 43 of the valve plate 41 and leaves the reactor through the single outlet tube 16 which likewise passes through the reactor bottom 34. In this step, the coating thickness distribution illustrated schematically in FIG. 3B and already explained in conjunction with FIGS. 1B and 2B is obtained.

In the reactor shown in FIG. 3C, the flow direction is reversed by means of the multipath valve 40. For this purpose, only the valve plate 41 must be rotated through 180° from outside by means of an adjusting shaft 46 without any valve outside the reactor having to be actuated. The precise design and function of this valve are explained below with reference to FIGS. 4A and 4B.

The design and arrangement of the multipath valve 40 require only a single inlet tube 15 and a single outlet tube 16, in other words a total of only two gas pipe feedthroughs. In the position shown in FIG. 4B, the reaction gas passes through the double-armed valve duct 43, spreads out rotationally symmetrically beyond the valve plate 41 due to a distribution and compensation plate 44 and a cover ring 22 and after passing through the base support 17 which is open and supports all of the upper reactor elements, enters the reaction chamber 12. The reaction gas passes through the reactor chamber 12 as a rising fresh gas S.G., with the deposition process explained in conjunction with FIG. 3A taking place along the rising flow until finally the used reaction gas enters the upper end of the central gas tube 14, passes through the latter through a pair of connecting tubes 14.1 and 14.2 as well as the valve duct 42 to the outlet tube 16, and is discharged at this point.

Figure 3B:
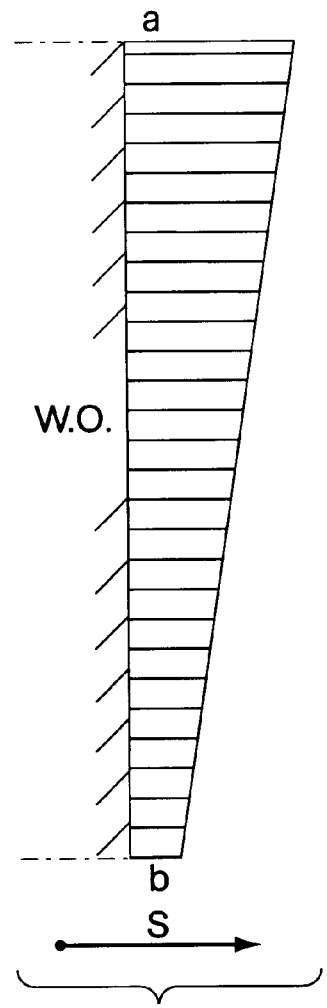
FIG. 3B is a graph showing the coating thickness distribution that results from the coating process according to FIG. 3A.
Figure 3C:
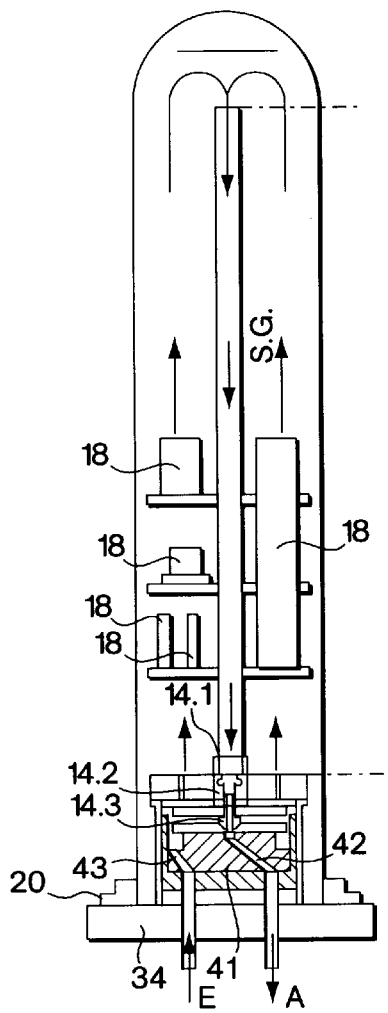
FIG. 3C is a schematic diagram of the CVD reactor according to the invention in accordance with FIG. 3A, in which, during a subsequent interval, the reaction mixture is introduced and rises.
Figure 3D:
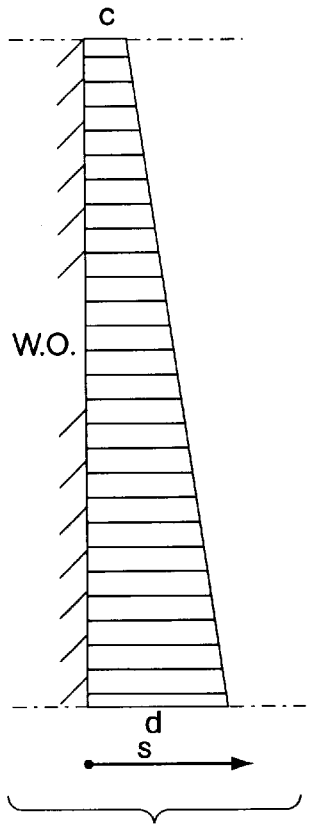
FIG. 3D is a graph of the coating thickness distribution that results from the coating process according to FIG. 3C.

FIGS. 3B and 3D show schematically the coating thickness distributions along the entire reactor chamber for falling reaction gas F.G. and/or rising reaction gas S.G., which are also representative of other criteria that affect reaction efficiency and coating quality.

As a result of rising and falling gas flows for short periods of time, as a result of the valve positions that can be adjusted as desired over time, coating growth is controlled in such fashion that the deposits laid down at intervals grow "layerwise" additively to produce material-specific laminates with a laminate thickness distribution that is quite uniform over the entire reaction distance, so that eventually a suitably uniform polylaminate and/or a largely uniform and homogeneously structured multilayer coating is produced as indicated schematically in FIGS. 3A–3E for individual laminates.

Figure 3E:
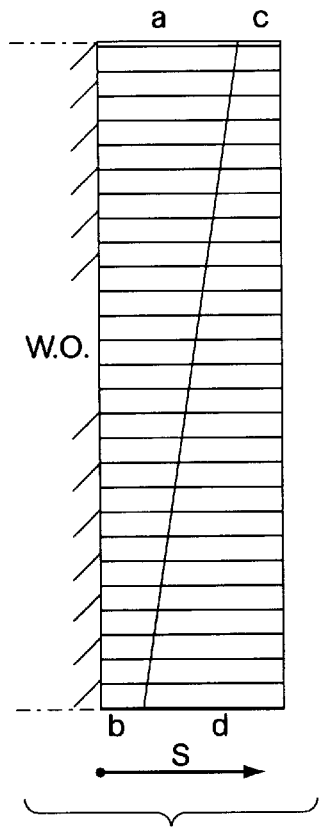
FIG. 3E shows the total coating thickness distribution according to the coating processes according to FIGS. 3A and 3C as a superimposition of the coating thickness distributions according to FIGS. 3B and 3D.

Initially one would conclude that for a uniform coating thickness distribution according to FIG. 3E, control intervals of the same length would be required. In practice, this is not the case for many reasons so that both the switching frequency and the respective switching interval as well as the switching ratio play an important role. As a result of this invention, because of the simple and reliable design principle, outstanding adaptability to the specific reaction, system, workpiece, material, and application requirements is possible. This is especially true when multilayer and polylayer coating systems must be deposited and especially when new quantum leaps are to be achieved with polylaminates in which the individual laminates are composed of numerous coating layers only a few nanometers thick. In practice, appropriate values for the switching frequency, switching interval, and switching ratio are not predicted in advance since these values will vary according to the geometries and numbers of parts being coated, the base material of the parts, the coating material and corresponding echant, the flow rate, and the desired coating characteristics. Thus, the switching frequency, switching interval, and switching ratio may be set by altering these values until a desired coating characteristic is reached.

The advantages of the invention become increasingly important the thinner the individual coating layers become. This is explained with reference to the triplex layer TiC—TiCN—TiN according to FIGS. 5A and 5B by comparison with the layer already described in conjunction with FIG. 2B.

Figure 5A:
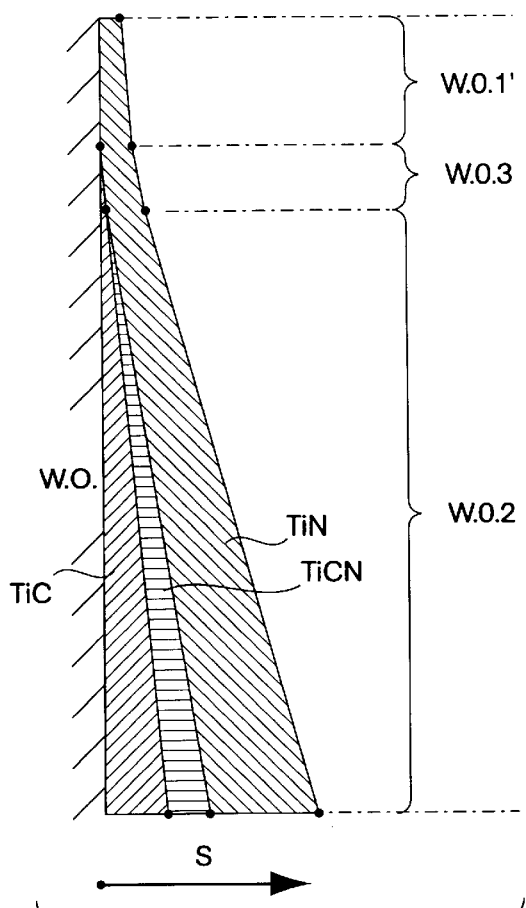
FIG. 5A is a graph showing the coating thickness distribution in a TiC—TiCN—TiN triplex coating with rising reaction gas as in FIG. 2B.
Figure 5B:
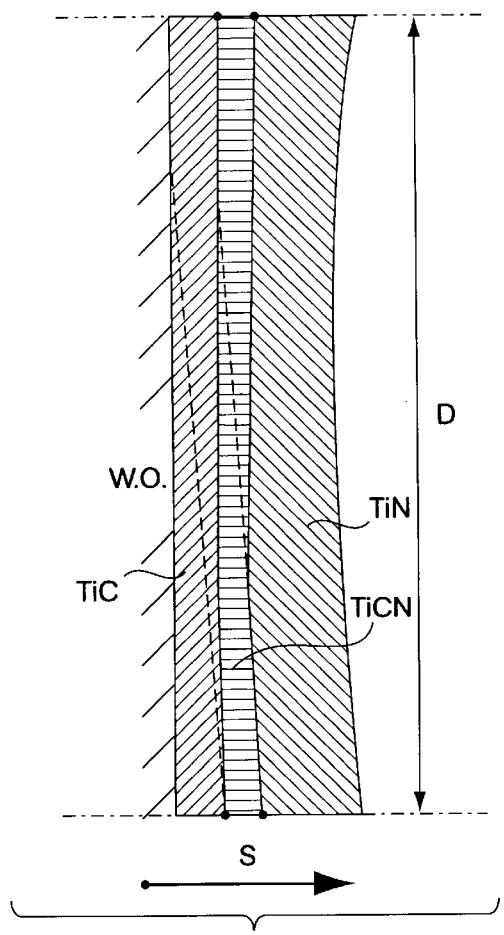
FIG. 5B shows the total coating thickness distribution in contrast to FIG. 5A with alternately rising and falling reaction gas by analogy with FIG. 3E.

Assuming a rather long reaction distance D (for example D=1.5 m), i.e. a correspondingly larger reactor, only the inadmissible coating thickness distribution shown in FIG. 2B which is also shown in FIG. 5A. could be achieved because of only one flow direction. As a result of the direction reversal, the coating thickness distribution shown in FIG. 5B is obtained (in the same or a slightly shorter coating time). In this example, it is assumed for the purpose of explaining certain possible variations that the valve positions are set slightly asymmetrically in the process phases for TiC and TiCN coating formation, so that the stepwise growth of the individual layers with the rhythm of the gas reversal cycles produces coating thickness profiles slightly offset with respect to TiC and TiCN laminates which however appear to be reduced in this case by the subsequent lamellar growth of the TiN laminate.

It is clear from these remarks that the implementation of a periodic gas reversal results in significant deposition improvement so that all elements conform to a narrowly definable coating thickness tolerance range (approximately 20%) at a high quality level and even the effectiveness of the reaction kinetics is displaceable within certain limits. As already explained, this outstanding coating uniformity takes on particular importance in the deposition of multilayer systems. Thus, for example, with an approximately 20% coating thickness tolerance in a 1.5 m reaction distance, ten laminates with an average one micron laminate thickness can be laid down reproducibly with little risk of the absence of a laminate, not even the lack of their individual, still much thinner layers.

Figure 4B:
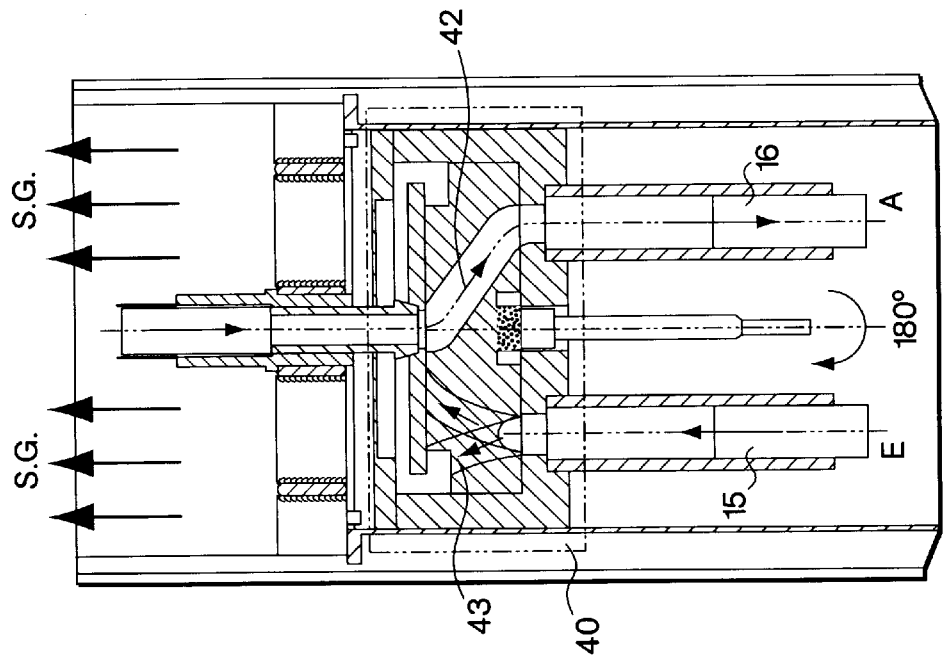
FIG. 4B is an enlarged axial section corresponding to FIG. 3C and similar to the section in FIG. 4A with rising reaction gas.
Figure 4A:
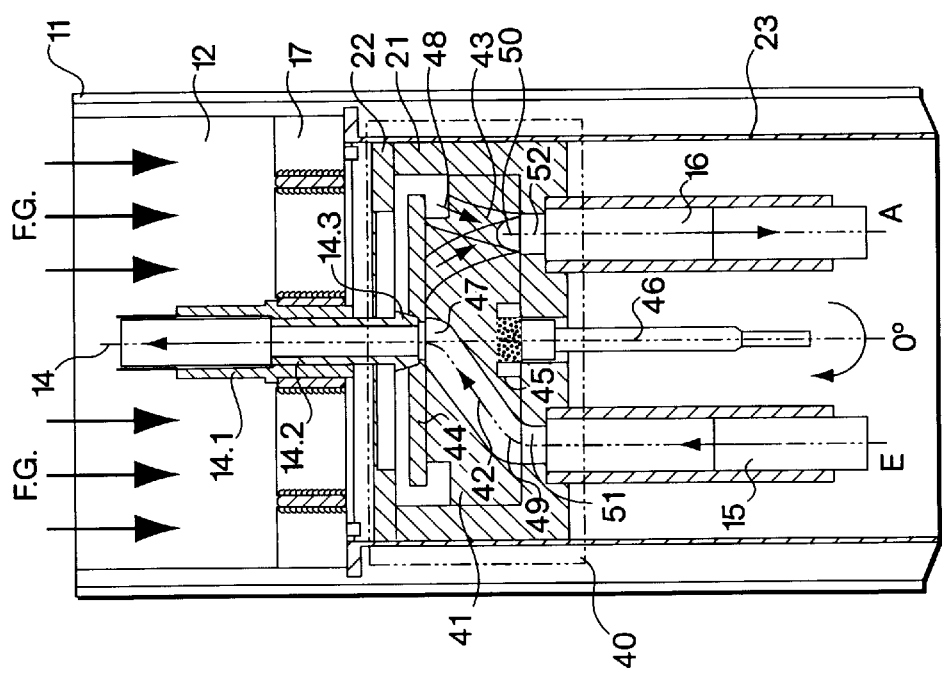
FIG. 4A is an enlarged axial section of the reactor according to the invention according to FIG. 3A in the vicinity of the multipath valve with falling reaction gas.

The multipath valve 40 according to the invention is shown in detail in FIGS. 4A and 4B.

The pot-shaped valve housing 21 serves as the basic body in which the valve plate 41 with the one-way valve duct 42 and the double-armed valve duct 43 are guided rotatably. The pot-shaped valve housing 21 is secured against twisting in the supporting tube 23 that is integral with the device. The end or opening 47 located above the one-way valve duct 42 terminates by the connecting tubes 14.2 and 14.1 with their telescopic action in the central gas tube 14. The connecting tube 14.2 that is inserted telescopewise into the connecting tube 14.1 rests with a hemispherical rotating body 14.3 on a distributor and the compensating disk 44 connected with the valve plate 41. A pair of ends 49, 50 of the valve ducts 42, 43 are located below and terminate in matching inlet and outlet openings 51 and 52 of the pot-shaped valve housing 21, to which the individual inlet and outlet tubes 15 and 16 connect. The valve plate 41 can be turned by means of a driver 45 by using an adjusting shaft 46 inside the pot-shaped valve housing 21 in such fashion that the gas supplied passes alternately through the one-way valve duct 42 and the central gas tube 14 as a falling reaction gas F.G. into the reaction chamber 12, with the double-armed valve duct 43 opening the connection between the reactor chamber 12 and the outlet tube. For a rising reaction gas S.G., the valve plate 41 is rotated 180°, as indicated by FIG. 4B, with the double-armed valve duct 43 delivering the fresh gas directly into the reaction chamber 12 (rising gas S.G.) while the one-way valve duct 42 forms the connection to the exhaust gas tube 16.

Figure 6A:
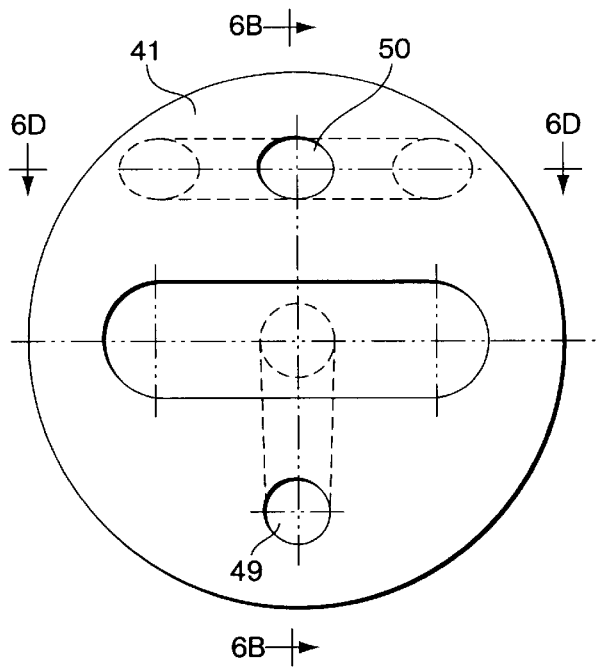
FIG. 6A is a view of the underside of a valve plate according to teh present invention.
Figure 6B:
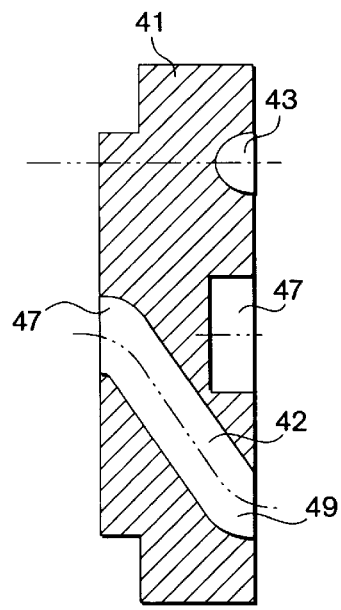
FIG. 6B is a section along line B—B in FIG. 6A.
Figure 6C:
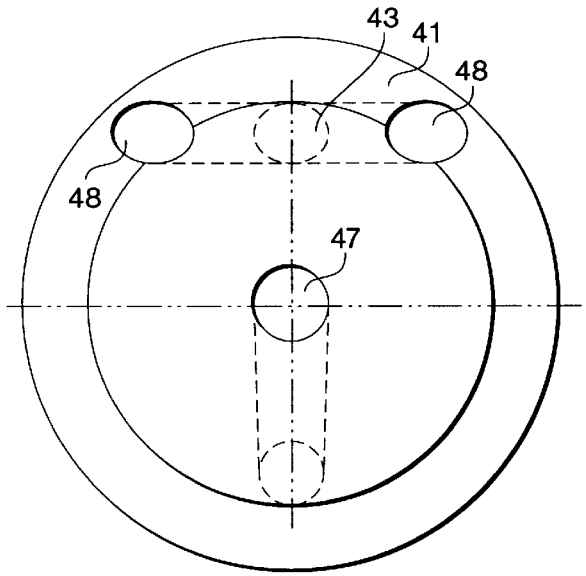
FIG. 6C is a view of the top of a valve plate according to the present invention.
Figure 6D:
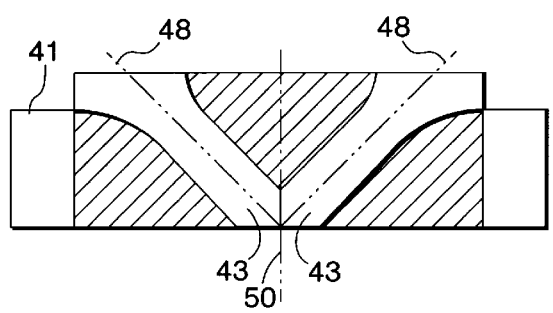
FIG. 6D is a section along line A—A in FIG. 6A.

Details of the rotatable valve plate 41 can be seen in the views in FIGS. 6A and 6C as well as the sections in FIGS. 6B and 6D.

The coating method according to the invention makes it possible that, even with reaction distances over 2.5 m, coating qualities can be obtained that were previously not considered possible, so that CVD plants are possible. Another advantage of the method according to the invention, namely the gas reversal principle that can be controlled as desired, consists in the fact that coating growth is increased over the entire length of the reaction chamber by up to approximately 30% and, depending on the way the process is conducted, can also specifically influence the structure of tribologically active topographies of the outermost coating surface.

Since the valve system includes the pot-shaped valve housing 21, the cover ring 22, the distribution and compensation plate 44, the connecting tube 14.2 with the rotating body 14.3, the adjusting shaft 46 and the driver 45 which are exposed to the hot reaction gases that frequently contain halides, the latter are made of graphite that is resistant to temperature and corrosion.

Adjusting the shaft 46 is introduced into the housing through a gas-tight rotating feedthrough (not shown) into the reactor interior, and can be operated from outside. The rotating feedthrough has a flexible, reinforced, vacuum- and pressure-tight seal in order reliably to prevent gas from escaping or entering.

According to another feature of the invention, the reactor is sealed off from the working environment by a sealing system that is specially designed for permanent functional reliability of the multipath valve 40. The sealing system is designed so that the multipath valve 40, despite being proximal to the sealing point between the reactor flange 20 and the reactor bottom 34, can be operated at (high) process temperatures. The high operating temperature of the multipath valve 40 is necessary because certain exhaust gas components condense when cooled and form adhering coatings together with the reaction dust particles that are always present. The coatings could block the multipath valve and clog the ducts in the valve plate 41 as well as ducts in the valve housing outlet 52 and the outlet tube 16. Therefore, in order to prevent the multipath valve 40 from malfunctioning, the outlet pipe must therefore also be made as short as possible and the proximity of the multipath valve 40 and the sealing location is specified. In order to keep heat transfer to the sealing rings 26 low despite the short distances involved, an especially efficient, multiply redundant sealing system is helpful.

Since fresh gas flowing through inlet tube 15 is further impeded by the formation of deposits, pressure can build up when there is a blockage of the exhaust gas in the reactor housing 11 which in a simply designed sealing system would result in the danger of toxic gases escaping into the working environment.

Figure 7:
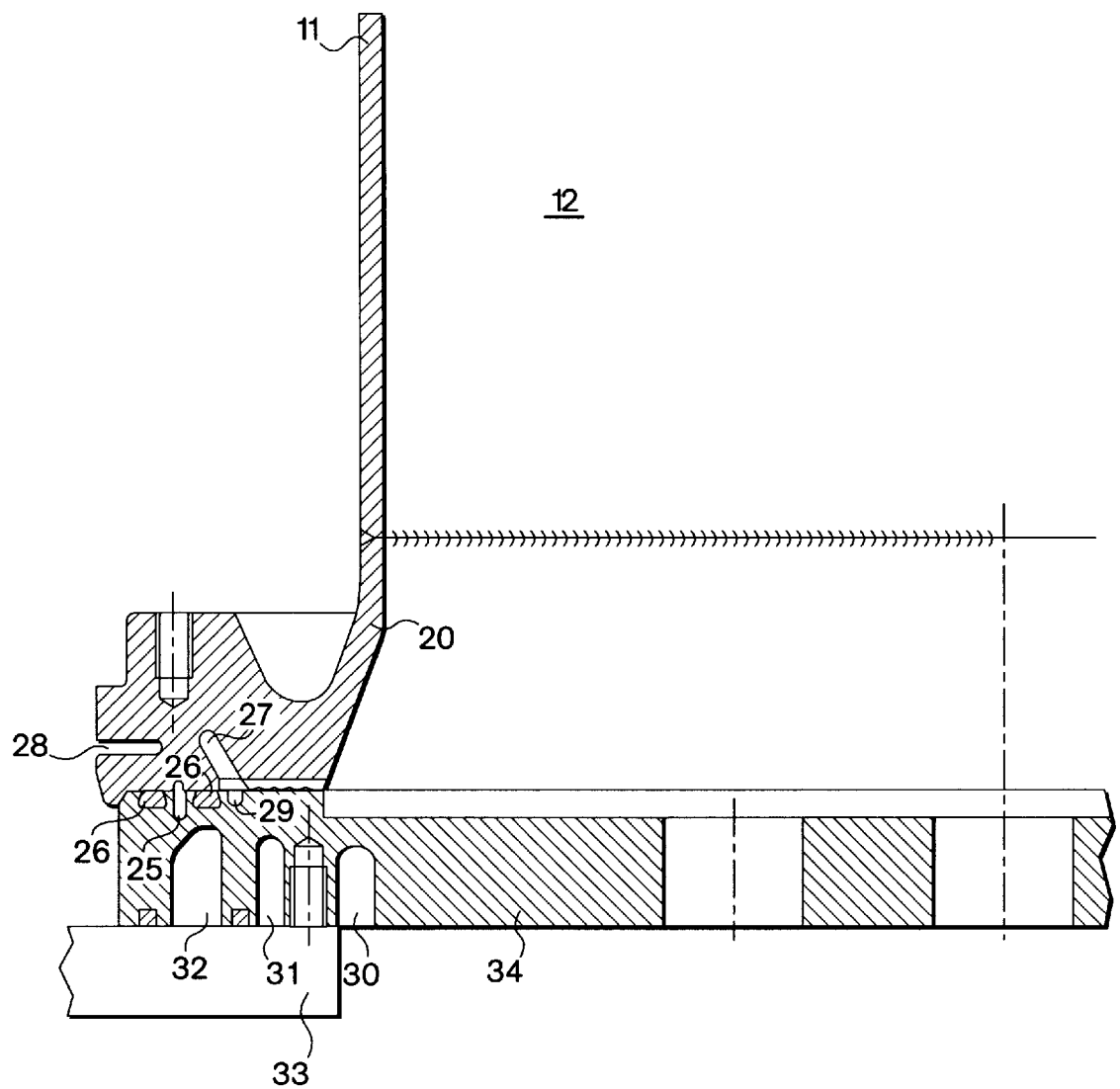
FIG. 7 is an enlarged, partially sectioned, lateral partial view of the reactor according to the invention in the vicinity of the reactor flange and reactor bottom.

Details of a sealing system between a reactor flange 20 and the reactor bottom 34 are shown in FIG. 7. Two temperature-resistant O-rings 26 are placed in two concentric annular grooves in the reactor bottom 34. Between the O-rings 26, there is also an annular vacuum duct 25 that is connected with a vacuum pump, not shown here, to produce a supporting vacuum.

In order to avoid excessive heating of the O-rings 26, a plurality of annular ducts 27–31 are cut in the reactor flange 20 and the reactor bottom 34 to form heat barriers. In the outer area, a cooling duct 32 through which water flows serves to carry away the heat.

The double seal with the O-rings 26 produces a hermetically closed sealing duct that can be exposed to the above-mentioned supporting vacuum which can be permanently monitored by pressure sensors regarding the state of the seal and the necessary vacuum and can be varied depending on the situation. Since the pressure in the supporting vacuum is always kept below the pressure in the reaction chamber, ambient air does not penetrate the reaction chamber nor can reaction gas escape into the working environment. In both cases, the leak flows would be permanently drawn off by the pumping system of the supporting vacuum. For this reason, even when there is stagnation of the exhaust gas, no reaction gas can penetrate the working environment of the operating personnel since the gases are drawn off by the supporting vacuum pump if they pass through the inner O-ring 26 even before the gas could pass through the outer O-ring 26. The double seal and supporting vacuum system as well as the heat-damped positioning of the O-rings 26 inside the heat barriers 27–31, plus the circulatory cooling produce an inseparable self-regulating system to prevent any malfunctions of the multipath valve 40 with a high degree of reliability.

Thus this design represents a closed redundant safety concept that makes it possible not only to use the gas reversal technology described here, especially the multipath valve, under optimum operating conditions with very high processing safety, but also permanently to control it, even in extremely compactly operating large systems under the most difficult deposition reactions, possibly also with toxic reactants.

While the invention has been disclosed in connection with the preferred embodiments shown and described in detail, various modifications and improvements thereon will become readily apparent to those skilled in the art. Accordingly, the spirit and scope of the present invention is to be limited only by the following claims.

What is claimed is:

1. Method for CVD surface coating, comprising:
    introducing gaseous substances in a CVD reactor chamber in a first flow direction, said substances precipitating onto other materials; and
    reversing the flow direction, whereby successively alternating the flow direction creates a pulsed gas flow of the gaseous substances.

2. A CVD reactor system, comprising:
    a vertical reactor chamber;
    a gas inlet tube that provides a reaction gas to the chamber;
    a gas outlet tube that exhausts gas from the chamber;
    a central gas tube that introduces the reaction gas into the reactor chamber, the tube being sealed off gas-tight at a bottom portion thereof by a base plate through which the gas inlet and gas outlet tubes are guided;
    a multipath valve, at least a portion of which is disposed inside the reactor chamber and integrated into the base plate, the valve having a pot-shaped valve housing, the valve having portions that rotate to couple the central gas tube to one of the inlet and outlet tubes, wherein portions of the valve which are not heated significantly below process temperature include temperature and corrosion resistant graphite; and
    an adjusting shaft that passes through the valve housing in a sealed manner to provide rotational coupling thereto, whereby alternating coupling of the central gas tube with the inlet and outlet tubes reverses gas flow from the central gas tube to the reactor chamber.

3. A CVD reactor system, according to claim 2, wherein the multipath valve includes a valve plate disposed inside the valve housing, the valve plate having at least first and second valve ducts that cause rotation of the valve plate to couple the central gas tube to one of the gas inlet tube and gas outlet tube while coupling the reactor chamber to an other one of the gas inlet tube and gas outlet tube.

4. A CVD reactor system, according to claim 3, wherein the valve plate and the adjusting shaft are connected, on a side thereof facing away from the reactor chamber, to a centrally located driver, wherein the adjusting shaft is located between the inlet and outlet tubes and has an end extending away from the valve plate and the reactor chamber.

5. A CVD reactor system, according to claim 2, wherein the multipath valve has a plate with at least two valve ducts, one of the valve ducts being connected at an end thereof with the central gas tube and an other one of the valve ducts being connected at an end thereof with the reactor chamber and wherein other ends of the valve ducts are each coupled to one of the gas inlet tube and gas outlet tube and are alternatively coupled according to rotational position of the multipath valve.

6. A CVD reactor system, according to claim 5, wherein an end of the central gas tube facing the valve plate has a hemispherical rotating body with a hole therethrough, the body resting in a sealed and rotatable manner on a distributing and compensating plate of the valve plate.

7. A CVD reactor system, according to claim 2, further comprising:
    a reactor housing surrounding the reactor chamber and sealed domewise at an upper end thereof, the reactor housing having flange coupled to a bottom portion of the reactor; and
    a temperature-resistant redundant double-sealing system provided at the flange and having two concentric sealing rings and a vacuum duct located therebetween.

8. A CVD reactor system, according to claim 7, further comprising:
    a leak, test, and warning system, coupled to the vacuum duct, wherein the vacuum duct is subjected to a vacuum to form a supporting vacuum and to draw off any leaking gases.

9. A CVD reactor system, comprising:
    a reactor chamber; and
    a multipath valve, coupled to the reactor chamber to provide gas thereto, the valve having a first position for providing the gas in a first direction and having a second position for providing the gas in a different direction.

10. A CVD reactor system, according to claim 9, further comprising:
    a gas inlet coupled to the multipath valve;
    a gas exhaust coupled to the multipath valve; and
    a central tube, coupled to the multipath valve to provide gas from the multipath valve to the reactor, wherein the multipath valve causes one of the gas inlet and gas exhaust to be coupled to the central tube according to the position of the multipath valve.

11. A CVD reactor system, according to claim 10, wherein the multipath valve includes a pot-shaped valve housing and a valve plate disposed in the valve housing that rotates to couple the central tube to one of the gas inlet and gas exhaust.

12. A CVD system, according to claim 11, wherein the valve plate has valve ducts corresponding to the gas inlet and the gas exhaust, wherein at least one of the ducts is coupled to the central tube.

13. A CVD reactor system, according to claim 12, wherein an end of the central gas tube facing the valve plate has a hemispherical rotating body with a hole therethrough, the body resting in a sealed and rotatable manner on a distributing and compensating plate of the valve plate.

14. A CVD reactor system, according to claim 9, further comprising:
    a reactor housing surrounding the reactor chamber and having a flange coupled to a bottom portion of the reactor; and
    a temperature-resistant redundant sealing system provided at the flange and having two concentric sealing rings and a vacuum duct located therebetween.

15. A CVD reactor system, according to claim 14, further comprising:

a leak, test, and warning system, coupled to the vacuum duct, wherein the vacuum duct is subjected to a vacuum to form a supporting vacuum and to draw off any leaking gases.

16. A CVD reactor system, according to claim 9, further comprising:

an adjusting shaft, coupled to the multipath valve to adjust of the multipath valve between the first and second positions.

17. A multipath valve, comprising:

a housing;

an inlet port disposed in the housing;

an outlet port disposed in the housing;

a central port disposed in the housing;

a rotatable plate disposed in the housing and having at least two ducts therethrough, wherein in a first position, the rotatable plate couples the inlet port to the central port and wherein in a second position, the rotatable plate couples the outlet port to the central port.

18. A multipath valve, according to claim 17, wherein the central port includes a hemispherical rotating body with a hole therethrough, the body resting in a sealed and rotatable manner on a distributing and compensating plate of the rotatable plate.

19. A multipath valve, according to claim 17, further comprising:

an adjusting shaft, coupled to the multipath valve to adjust of the rotatable plate between the first and second positions.

20. A multipath valve, according to claim 17, wherein portions of the valve are coated with graphite.

* * * * *